(12) United States Patent
North et al.

(10) Patent No.: US 10,399,190 B2
(45) Date of Patent: Sep. 3, 2019

(54) LIQUID-VAPOR PHASE CHANGE THERMAL INTERFACE MATERIAL

(71) Applicant: DELL PRODUCTS, L.P., Round Rock, TX (US)

(72) Inventors: Travis C. North, Cedar Park, TX (US); Austin Michael Shelnutt, Leander, TX (US); Chris Helberg, Austin, TX (US); Rene Jason Salas, Round Rock, TX (US)

(73) Assignee: Dell Products, L.P., Round Rock, TX (US)

( * ) Notice: Subject to any disclaimer, the term of this patent is extended or adjusted under 35 U.S.C. 154(b) by 409 days.

(21) Appl. No.: 14/455,580

(22) Filed: Aug. 8, 2014

(65) Prior Publication Data

US 2016/0044824 A1    Feb. 11, 2016

(51) Int. Cl.
*H01L 23/427* (2006.01)
*G06F 1/20* (2006.01)
*H05K 7/20* (2006.01)
*B23P 15/26* (2006.01)

(52) U.S. Cl.
CPC .............. *B23P 15/26* (2013.01); *G06F 1/20* (2013.01); *H01L 23/427* (2013.01); *G06F 2200/201* (2013.01); *H01L 2924/0002* (2013.01)

(58) Field of Classification Search
CPC .............. G06F 2200/201; G06F 1/203; F28D 15/0266; F28D 7/0075
See application file for complete search history.

(56) References Cited

U.S. PATENT DOCUMENTS

| | | | | |
|---|---|---|---|---|
| 5,561,590 A | * | 10/1996 | Norell | H01L 23/3733 165/185 |
| 5,940,270 A | * | 8/1999 | Puckett | F28D 15/0266 165/104.33 |
| 6,665,186 B1 | * | 12/2003 | Calmidi | H01L 23/16 165/80.4 |
| 7,095,111 B2 | * | 8/2006 | Hu | H01L 23/36 257/714 |
| 7,369,411 B2 | * | 5/2008 | Hill | H01L 23/4275 165/185 |
| 7,543,629 B2 | * | 6/2009 | Chin | F28D 15/043 165/104.21 |
| 7,599,185 B2 | * | 10/2009 | Meyer, IV | H01L 23/427 165/104.21 |

(Continued)

*Primary Examiner* — Jayprakash N Gandhi
*Assistant Examiner* — Hung Q Dang
(74) *Attorney, Agent, or Firm* — Isidore PLLC (57) ABSTRACT

An assembly for cooling a heat dissipating device reducing the thermal contact/interface resistance between a heatsink and a heat dissipating device includes: a heat dissipating device having a heat releasing surface; a heatsink having a heat absorbing surface; a gasket extending between the heat releasing surface and the heat absorbing surface to provide a sealed interstitial cavity; and a working fluid provided within the cavity. The working fluid has specific thermal properties that cause the fluid to (i) absorb latent heat and evaporate from a liquid to a vapor at the liquid surface in contact with the heat releasing surface during operation of the heat dissipating device and (ii) condense from the vapor back to the liquid when the vapor contacts the heat absorbing surface of the heatsink, thus releasing the latent heat from the vapor to the heatsink.

20 Claims, 9 Drawing Sheets

(56) References Cited

U.S. PATENT DOCUMENTS 8,305,762 B2 * 11/2012 Wits .................. F28D 15/0233
165/104.26
2007/0289668 A1 * 12/2007 Costanzo .............. A61J 1/2096
141/319

* cited by examiner

LIQUID-VAPOR PHASE CHANGE THERMAL INTERFACE MATERIAL

BACKGROUND

1. Technical Field

The present disclosure generally relates to cooling of electronic devices and components and in particular to cooling of devices and components within an information handling system.

2. Description of the Related Art

As the value and use of information continue to increase, individuals and businesses seek additional ways to process and store information. One option available to users is information handling systems. An information handling system generally processes, compiles, stores, and/or communicates information or data for business, personal, or other purposes, thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

During system operation, the electronic hardware components of an information handling system generate heat. In order for the information handling system to properly function, these electronic components are required to remain below a certain temperature during operation. Thus, the generated heat has to be removed from the devices and/or the system. Conventional systems utilize fans and heat sinks to remove heat from the electronic components and in the process cool the different components of the information handling system. With the use of heat sinks, conventional applications attach the heat sinks to a surface of the device being cooled using an intermediate thermal interface material (TIM), such as silicone loaded with conductive filler material such as aluminum, for example. The TIM applied at the surface of the heat sink adds an amount of thermal resistance that negatively affects the overall heat removal efficacy of the heat sink. For example, the TIM can add as much as 50% of the total thermal resistance for a high performance heat sink. Additionally, the conventional silicone-based TIMs do not work well with and/or are impractical within immersion cooling applications, as the silicone tends to dissolve in the immersion coolants. An ongoing need exists for improved cooling of components utilized within information handling systems with consideration given for TIM solutions that can also operate in an immersion cooling environment.

BRIEF SUMMARY

Disclosed are an assembly, an information handling system and a method for improved the cooling efficacy of a heat sink by reducing thermal contact/interface resistance between the heat sink and an associated heat dissipating device. According to one embodiment, the assembly includes: the heat dissipating device having a casing with a first exterior surface at which heat can be removed from the device (i.e., a "heat releasing surface"); a heatsink having a base panel with an exterior-facing surface which absorbs heat impacting the surface (i.e., a "heat absorbing surface"), the heat absorbing surface fixed in place across from the heat releasing surface by a first separation distance; and a gasket having a closed perimeter and which extends across the separation distance to form a volumetric space between the heat releasing surface and the heat absorbing surface and is sealably attached to both the heat releasing surface and the heat absorbing surface to provide a sealed interstitial cavity. The assembly also includes a working fluid inserted within the cavity. The working fluid has specific thermal properties that cause the fluid to (i) absorb latent heat and evaporate from a liquid to a vapor when the liquid contacts the heat releasing surface during operation of the heat dissipating device and (ii) condense from the vapor back to the liquid when the vapor contacts the heat absorbing surface of the heatsink, thus releasing the latent heat from the vapor to the heatsink.

The above summary contains simplifications, generalizations and omissions of detail and is not intended as a comprehensive description of the claimed subject matter but, rather, is intended to provide a brief overview of some of the functionality associated therewith. Other systems, methods, functionality, features and advantages of the claimed subject matter will be or will become apparent to one with skill in the art upon examination of the following figures and detailed written description.

BRIEF DESCRIPTION OF THE DRAWINGS

The description of the illustrative embodiments can be read in conjunction with the accompanying figures. It will be appreciated that for simplicity and clarity of illustration, elements illustrated in the figures have not necessarily been drawn to scale. For example, the dimensions of some of the elements are exaggerated relative to other elements. Embodiments incorporating teachings of the present disclosure are shown and described with respect to the figures presented herein, in which.

DETAILED DESCRIPTION

The illustrative embodiments provide an assembly, an information handling system and a method for cooling a heat dissipating device and reducing the thermal contact/interface resistance between a heat sink and a heat dissipating device. According to one embodiment, the assembly includes a sealed interstitial cavity extending between a heat releasing surface of a heat dissipating device and a heat absorbing surface of a heat sink. A working fluid is provided within the cavity. The working fluid has specific thermal properties that cause the fluid to (i) absorb latent heat and evaporate from a liquid to a vapor at the liquid surface in contact with the heat releasing surface during operation of the heat dissipating device and (ii) condense from the vapor back to the liquid when the vapor contacts the heat absorbing surface of the heatsink, thus releasing the latent heat from the vapor to the heatsink.

In the following detailed description of exemplary embodiments of the disclosure, specific exemplary embodiments in which the disclosure may be practiced are described in sufficient detail to enable those skilled in the art to practice the disclosed embodiments. For example, specific details such as specific method orders, structures, elements, and connections have been presented herein. However, it is to be understood that the specific details presented need not be utilized to practice embodiments of the present disclosure. It is also to be understood that other embodiments may be utilized and that logical, architectural, programmatic, mechanical, electrical and other changes may be made without departing from general scope of the disclosure. The following detailed description is, therefore, not to be taken in a limiting sense, and the scope of the present disclosure is defined by the appended claims and equivalents thereof.

References within the specification to "one embodiment," "an embodiment," "embodiments", or "one or more embodiments" are intended to indicate that a particular feature, structure, or characteristic described in connection with the embodiment is included in at least one embodiment of the present disclosure. The appearance of such phrases in various places within the specification are not necessarily all referring to the same embodiment, nor are separate or alternative embodiments mutually exclusive of other embodiments. Further, various features are described which may be exhibited by some embodiments and not by others. Similarly, various requirements are described which may be requirements for some embodiments but not other embodiments.

It is understood that the use of specific component, device and/or parameter names and/or corresponding acronyms thereof, such as those of the executing utility, logic, and/or firmware described herein, are for example only and not meant to imply any limitations on the described embodiments. The embodiments may thus be described with different nomenclature and/or terminology utilized to describe the components, devices, parameters, methods and/or functions herein, without limitation. References to any specific protocol or proprietary name in describing one or more elements, features or concepts of the embodiments are provided solely as examples of one implementation, and such references do not limit the extension of the claimed embodiments to embodiments in which different element, feature, protocol, or concept names are utilized. Thus, each term utilized herein is to be given its broadest interpretation given the context in which that terms is utilized.

Figure 1:
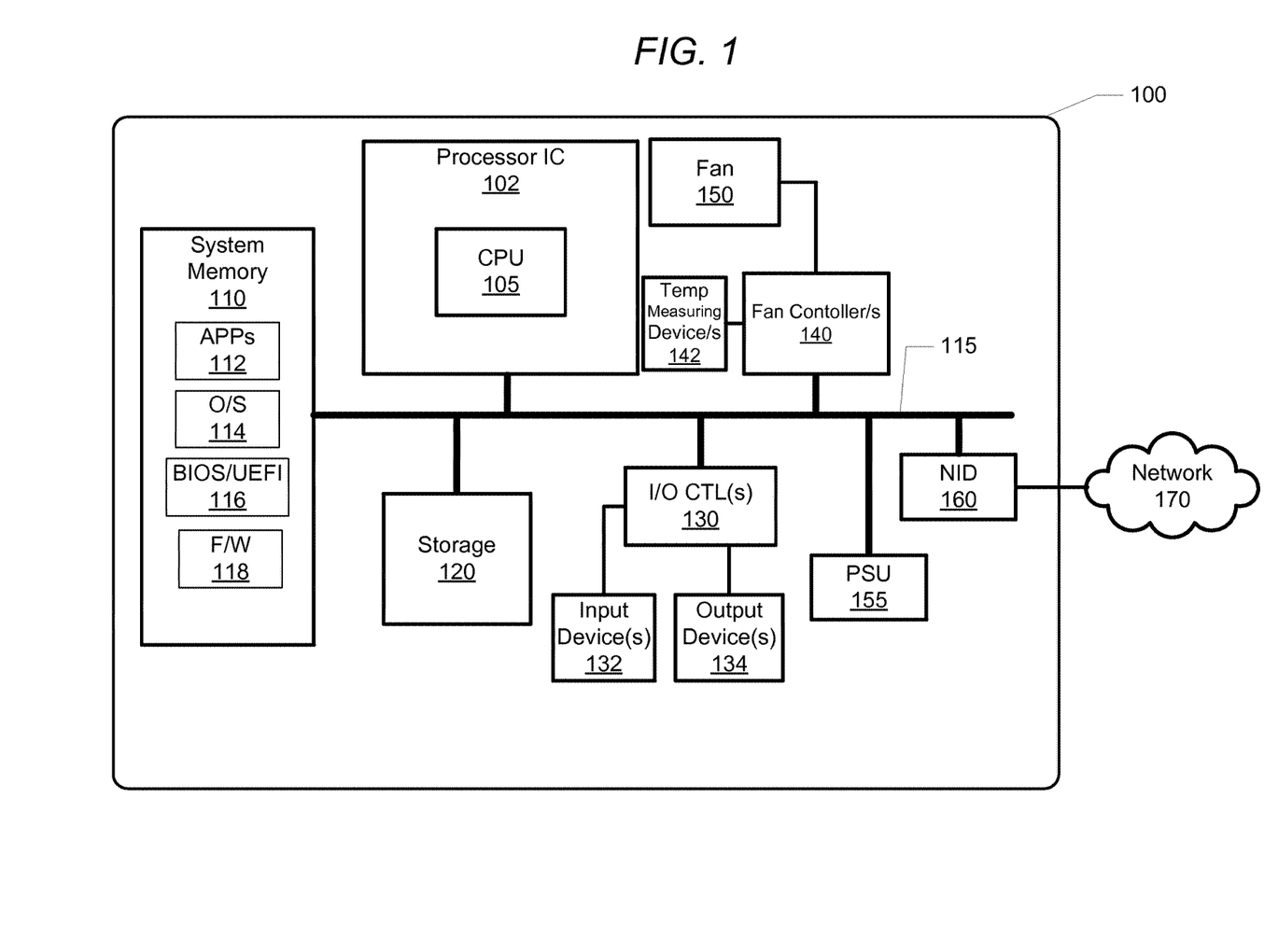
FIG. 1 illustrates an example block diagram of an information handling system within which various aspects of the disclosure can be implemented, according to one or more embodiments.

FIG. 1 illustrates a block diagram representation of an example information handling system (IHS) 100, within which one or more of the described features of the various embodiments of the disclosure can be implemented. For purposes of this disclosure, an information handling system, such as IHS 100, may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, or other purposes. For example, an information handling system may be a handheld device, personal computer, a server, a network storage device, or any other suitable device and may vary in size, shape, performance, functionality, and price. The information handling system may include random access memory (RAM), one or more processing resources such as a central processing unit (CPU) or hardware or software control logic, ROM, and/or other types of nonvolatile memory. Additional components of the information handling system may include one or more disk drives, one or more network ports for communicating with external devices as well as various input and output (I/O) devices, such as a keyboard, a mouse, and a video display. The information handling system may also include one or more buses operable to transmit communications between the various hardware components.

Referring specifically to FIG. 1, example IHS 100 includes a processor integrated circuit (IC) 102 having one of more central processing unit(s) 105. CPU 105 is coupled to system memory 110 via system interconnect 115. System memory can include dynamic random access memory (DRAMs) and/or other types of memory. System interconnect 115 can be interchangeably referred to as a system bus, in one or more embodiments. Also coupled to system interconnect 115 is storage 120 within which can be stored one or more software and/or firmware modules and/or data (not specifically shown). In one embodiment, storage 120 can be a hard drive or a solid state drive. The one or more software and/or firmware modules within storage 120 can be loaded into system memory 110 during operation of IHS 100. As shown, system memory 110 can include therein a plurality of software and/or firmware modules including application(s) 112, operating system (O/S) 114, basic input/output system (BIOS) 116 and firmware (F/W) 118.

In one or more embodiments, BIOS 116 comprises additional functionality associated with unified extensible firmware interface (UEFI), and can be more completely referred to as BIOS/UEFI 116 in these embodiments. The various software and/or firmware modules have varying functionality when their corresponding program code is executed by processor(s) 105 or other processing devices within IHS 100.

IHS 100 further includes one or more input/output (I/O) controllers 130 which support connection by, and processing of signals from, one or more connected input device(s) 132, such as a keyboard, mouse, touch screen, or microphone. I/O controllers 130 also support connection to and forwarding of output signals to one or more connected output devices 134, such as a monitor or display device or audio speaker(s) or light emitting diodes (LEDs).

Additionally, in one or more embodiments, IHS 100 includes one or more fans 150 for cooling the components of IHS 100 such as processor IC 102. IHS 100 further includes a fan controller 140 that is connected to fan 150 and to one or more temperature measuring devices 142, such as diodes and thermistors. Fan controller 140 is communicatively coupled with processor(s) 105 via system interconnect 115. Fan controller 140 can at least partially control the operation of fan 150, based in part on an ambient device temperature detected by temperature gauge/thermometer 142. IHS 100 can also include structures such as ducts within IHS 100 for directing the cooling air from fan 150 to locations within IHS 100. IHS 100 also includes one or more power supply units (PSUs) 155, which provide electrical power required to enable the various electrical/electronic components of IHS 100 to operate.

IHS 100 further comprises a network interface device (NID) 160. NID 160 enables IHS 100 to communicate and/or interface with other devices, services, and components that are located external to IHS 100. These devices, services, and components can interface with IHS 100 via an external network, such as example network 170, using one or more communication protocols. In one embodiment, a customer provisioned system/platform can comprise multiple devices located across a distributed network, and NID 160 enables IHS 100 to be connected to these other devices. Network 170 can be a local area network, wide area network, personal area network, and the like, and the connection to and/or between network 170 and IHS 100 can be wired or wireless or a combination thereof. For purposes of discussion, network 170 is indicated as a single collective component for simplicity. However, it is appreciated that network 170 can comprise one or more direct connections to other devices as well as a more complex set of interconnections as can exist within a wide area network, such as the Internet.

Those of ordinary skill in the art will appreciate that the hardware components and basic configuration depicted in FIG. 1 and described herein may vary. For example, the illustrative components within IHS 100 are not intended to be exhaustive, but rather are representative to highlight components that can be utilized to implement aspects of the present disclosure. For example, other devices/components may be used in addition to or in place of the hardware depicted. The depicted example does not convey or imply any architectural or other limitations with respect to the presently described embodiments and/or the general disclosure. In the description of the following figures, reference will also be made to FIG. 1 and/or other preceding figures and components introduced in the preceding figures.

Figure 2:
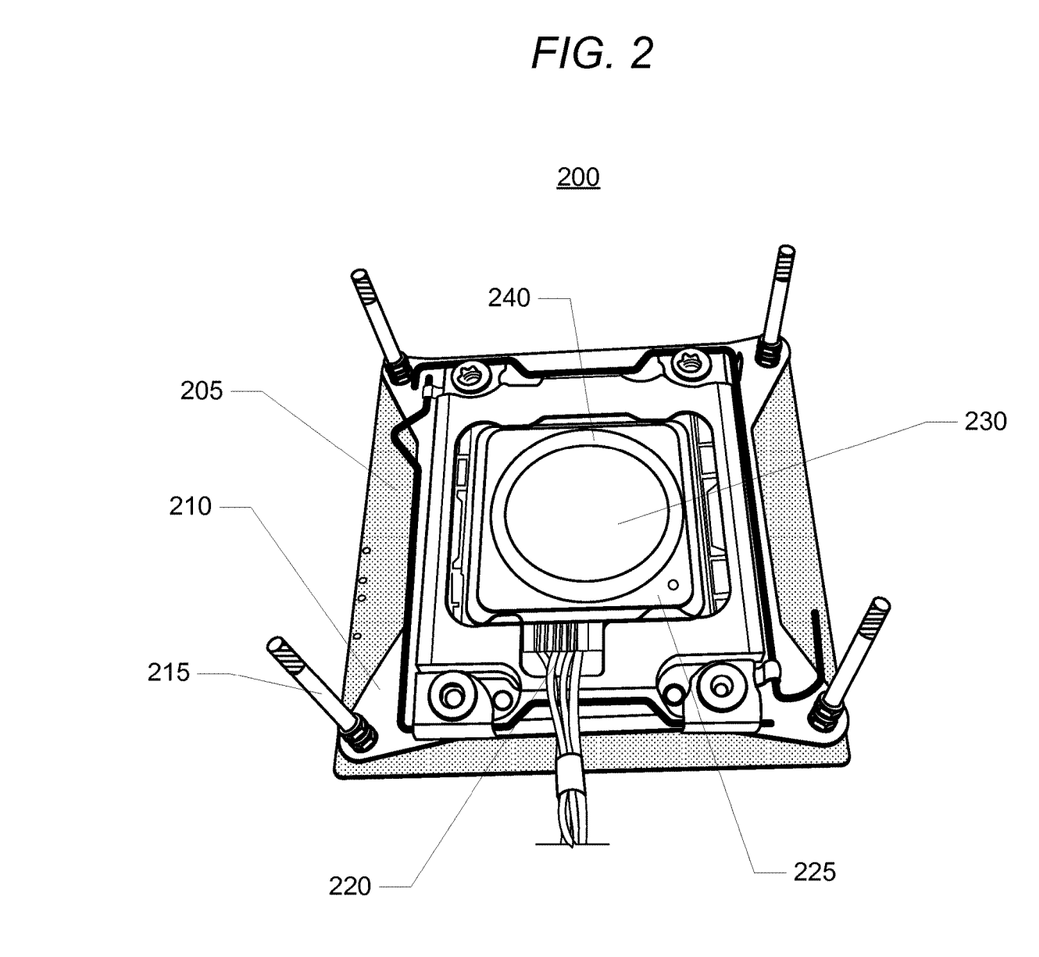
FIG. 2 illustrates an example central processing unit (CPU) component that serves as the example heat generating/dissipating device, designed with a gasket attached to and extending from the exposed heat releasing surface of the inner protective casing of the CPU, according to one embodiment.

With reference now to FIG. 2, there is illustrated an example processor device 200 having an external casing within which is housed a processor IC with one or more CPUs located thereon. The internal components are not specifically shown as the disclosure focuses more on the heat exchanges that occur outside of the processor device 200 involving just one of the surfaces of the exterior casing protecting the processing components that generate heat. For purposes of the description, a single one of the surfaces of the casing is illustrated and utilized in the description as the "heat releasing surface". It is however appreciated that heat can be released from each of the different surfaces of processor device 200. The description focuses on that specific surface to which the heat sink is conventionally attached, without implying any limitation on the applicability to other heat dissipating surfaces of any heat producing device. External casing comprises a base panel 205 on which sits a flanged frame 210. Flanged frame includes four bolts 215 attached thereto and which extend vertically outwards to allow a heat sink (shown in FIG. 3) to be connected on top of processor device 200. Also shown extending from one section of processing device 200 is a cabling structure 220 that provides both power and communication for processor device 200. It is appreciated and understood that heat dissipation during CPU processing occurs as a result of the use of electrical power received from the power supply (e.g., PSU 155). It is also appreciated that other physical features of processor device 200 that are illustrated but are not germane to the disclosure have not been specifically described herein.

As a general note, while the aspects of the disclosure are illustrated and described with specific reference to a CPU-heatsink assembly, it is appreciated that the functional elements of the disclosure are fully applicable to other heat generating devices and associated heat removal devices, without limitation. With the CPU example, a top plate of the CPU is defined as a CPU heat spreader and represents the material utilized to dissipate the majority of the heat generated by the components within CPU during operation. To generalize the disclosure, however, reference is made to the top surface of the casing of the CPU, which is further defined by its functional purpose of releasing heat. Returning to the description of FIG. 2, at the exposed, central section of processor device 200 is shown a square plate that can represent a top surface (225) of an external casing of the CPU and/or heat generating processing components of the CPU. This surface is referred to herein as the heat releasing surface 225 and represents the section of the processor device 200 at which a significant amount of heat dissipation occurs during CPU operation. Located on top of the heat releasing surface 225 is a circular structure in the shape of an annulus surrounding an interior surface area 230 of the heat releasing surface 225, The circular structure is referred to herein as a gasket 240, although other names can be utilized to describe the component. The shape and size of the gasket 240 as well as the actual area and resulting volume encompassed by the interior surface area 230 of the closed perimeter can vary across different embodiments. The gasket 240 extends up from the heat releasing surface 225 to form a volumetric space having the enclosed surface area, extended upwards by the height of the gasket. FIG. 4, described later, provides a more detailed view of the height dimension of the gasket 240 and application to provide a separation distance between the two surfaces (i.e., heat releasing surface 225 and heat absorbing surface 360 (FIG. 3).

Figure 3:
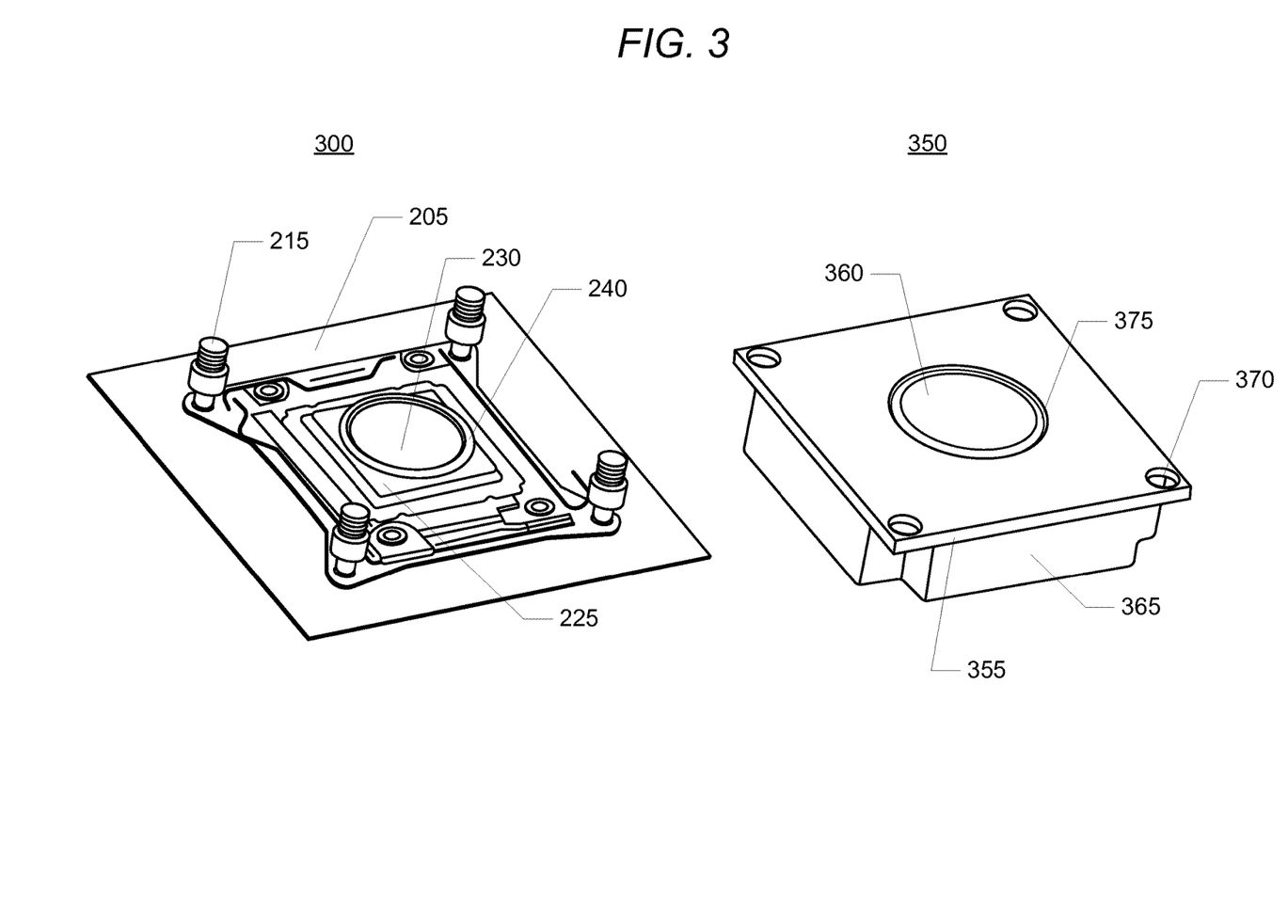
FIG. 3 provides schematics of the example heat dissipating device and heat sink respectively configured to support use of a gasket to provide a sealed cavity for heat exchange, according to at least one embodiment.

FIG. 3 illustrates schematic drawings of two separate components associated with one embodiment of an assembly that provides cooling of a heat dissipating device according to the aspects described herein. Specifically, the FIG. 3 illustration provides a processor device 300 (similar to processor device 200 but presented without several of the details of FIG. 2) and heatsink 350 designed to be installed on top of the processor device 300 and specifically on top of the heat releasing surface 225 of the CPU. As described above, heat releasing surface 225 of CPU casing includes an embedded or attached gasket 240, which extends upwards from the visible surface area inside the closed perimeter of the gasket 240 to create an enclosed area of heat releasing surface.

Focusing on the heatsink 350, in the illustrative embodiment, heatsink 350 includes a base plate 355 having an exterior surface that is referred to herein as the heat absorbing surface 360. On the opposite side of heatsink 350 are heat dissipating surfaces 365 which can be one or more fins or flanges that provide a relatively large surface area available for heat dissipation from heatsink 350 away from the CPU. As also shown, located at the four corners of the heat releasing surface are four holes for insertion of each of the four screw bolts 215 shown at the corner edges of the processor device 200. Heatsink 350 thus includes offsetting screw holes 370 for insertion of the screw bolts 215 of processor device 300 when the two components are assembled together. In the illustrative embodiment, heatsink 350 also includes a groove 375 having a perimeter shape similar to that of the gasket 240 located on heat releasing surface of CPU casing. Groove 350 is a closed perimeter indentation within the heat absorbing surface 360 that is the same shape and width as the top section of gasket 240. According to one embodiment, when CPU and heatsink 350 are assembled such that the bolts of processor device 200 extend through the holes of heatsink 350 and are tightened via nuts screwed onto the bolts, the heat absorbing surface 360 is brought directly opposite of the heat releasing surface 225, separated by a short distance which represents the height or partial height of the gasket 240, and the top section of gasket 240 nestles into the groove 375 to create a sealed interstitial cavity. It is appreciated that in alternate embodiments, the heat absorbing surface 360 can be flat (i.e., without a groove) and the interstitial cavity can be formed by compression of the top section of the gasket 240 against the heat absorbing surface 360 to create the seal. Gasket 240 is assumed to be a pliable material that allows for the depression of the top surface against either the inner surface of the groove 375 or the heat absorbing surface 360, when no groove exists, to provide a perfect seal along the entirety of the gasket 240 for holding a working fluid in both liquid and vapor form.

Heat sink 350 is shown turned upside down in order to better illustrate the presence of the heat absorbing surface 360 and the groove 375 contained therein. When turned over, the heat absorbing surface of heatsink 350 would sit directly opposite the heat releasing surface 225 of the CPU. In this orientation, with the fasteners in place (e.g., the bolts and nuts assemblies), the gasket 240 extends between the two heat exchange surfaces and provides the interstitial cavity that serves as the thermal interface material (TIM) between the heat producing CPU and heat dissipating heatsink.

Figure 4A:
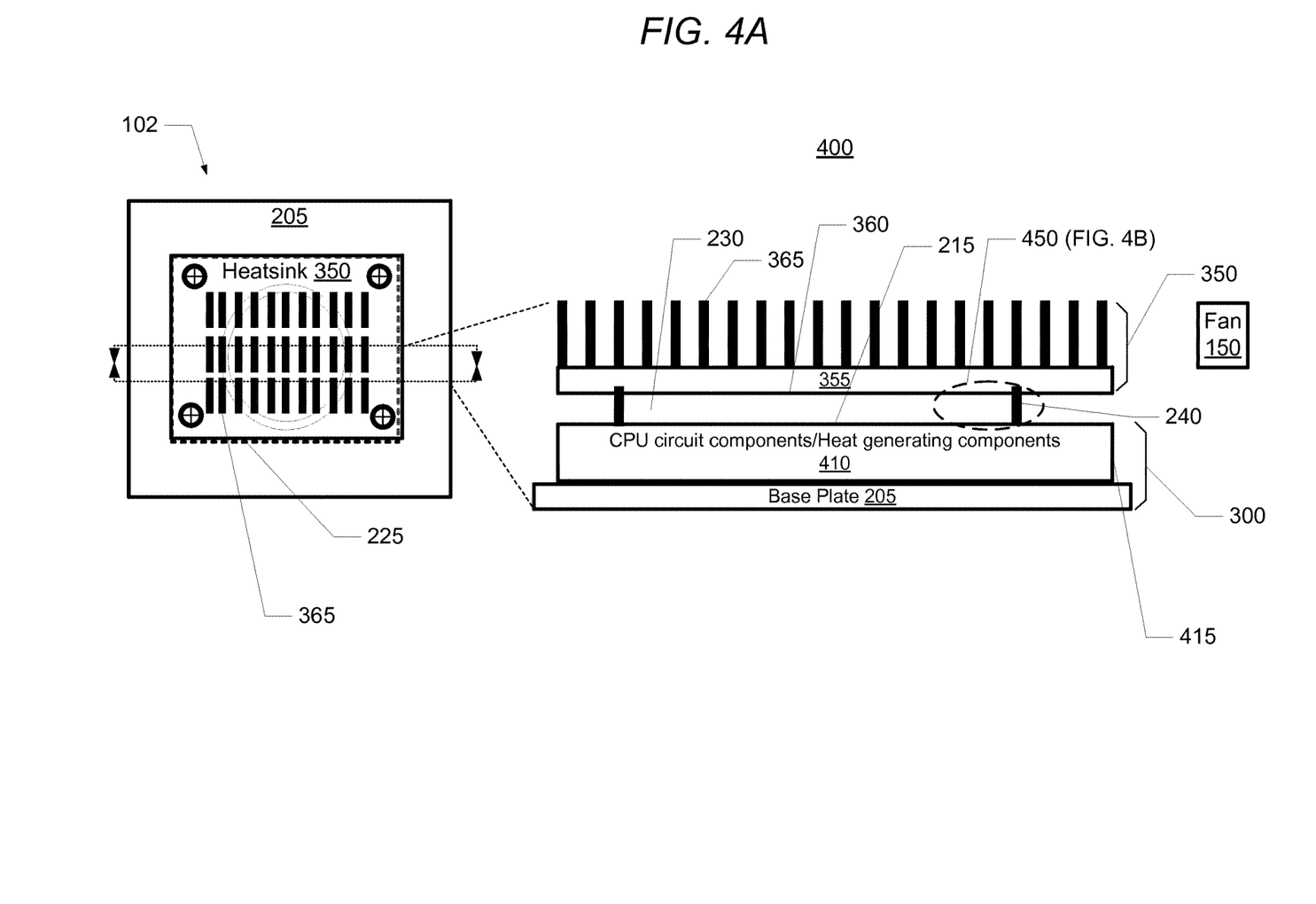
FIG. 4A provides a cross-sectional view of an example assembly including the CPU, as the heat dissipating device, and the heat sink assembled to provide a sealed interstitial cavity utilized to cool the CPU and reduce the thermal contact resistance at the heat exchange surfaces, in accordance with one or more embodiments.
Figure 4B:
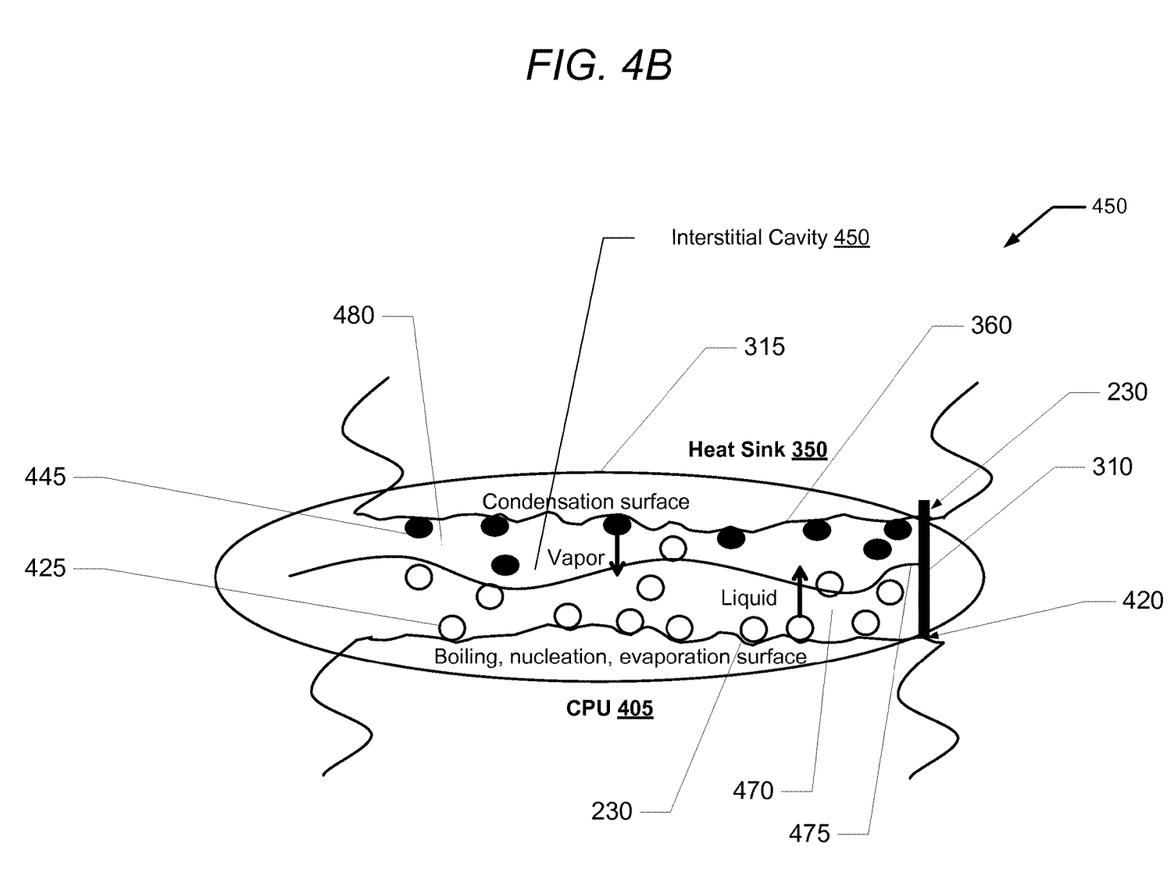
FIG. 4B is a zoomed-in view of a section of the cross sectional view of FIG. 4A, showing the interstitial cavity with heat exchange fluid going through phase transitions at the two heat exchange surfaces, according to one or more embodiments.

FIG. 4A illustrates a top view of an assembly 400 comprising processor device 300 and heatsink 350, the two example components of FIG. 3. FIG. 4B illustrates an example cross section of the assembly 400 that includes processor device 300 as a heat producing device and heatsink 350, assembled with an intervening gasket 240 to provide a fluid-based heat exchange interstitial cavity 450. The block figures to the left illustrate a top view of the assembly 400, which includes heat sink 350 (with lateral fins 365) placed on top of heat releasing surface 225 of CPU casing of processor device 300. It is appreciated that the relative sizes of the components can be different than shown. For example, the heat sink can be larger than the CPU or smaller. Top view is provided solely for illustration and is not described in any specific detail, as most detail is visible from the cross sectional view of assembly 400. As shown, processor device 300 includes base plate 205 on which processor IC (102, FIG. 1) and CPU circuit components 410 are located. CPU circuit components 410 represent heat generating components, which produce and/or emit heat during processing operations of CPU 105. CPU circuit components 410 are protected via an exterior casing, generally shown as the rectangular box 415. Casing 415 includes a top exterior surface, specifically referred to herein as the heat releasing surface 230. During CPU operation, heat is generated by the various electrical/circuit components 410 that comprise the CPU and the generated heat is passed/transferred through to the exterior casing to the exposed exterior surfaces of the casing. The amount of heat accumulating at the exterior surfaces and thus the temperature of the CPU increases during ongoing CPU operations unless that heat is removed from the exterior surface. According to the disclosure, the heat removal occurs via the connected heat sink 350, which sits atop the CPU as illustrated by the top view of the assembly 400. Heatsink 350 includes a base plate, with one surface facing the CPU. This side of heat sink 350 is referred to herein as heat absorbing surface 360. Heatsink 350 is shown having a plurality of fins 365 extending away from a base plate 355 to provide a larger surface area to remove the absorbed heat by convection cooling using air movement generated by a fan 150. Heat absorbing surface 360 and opposing heat releasing surface 230 are spatially separated by a "thermal interface material", which according to the disclosure is a fluid-based heat exchange interstitial cavity 450. As shown, the interstitial cavity 450 is created using a gasket 240 made of a sealable material extending from heat releasing surface 230 up to the heat absorbing surface 360, along a perimeter of a space or area 230 defined on the inside of the gasket 240. Within the descriptions which follow, the sealable material from which the gasket 240 is made can be a rubber material or a silicone material or a metallic, hybrid, or other type of material that allows for both liquid and gas exchange within the cavity formed by the gasket with minimal to no leakage of the fluid over an extended period of time. For simplicity, the sealable material is referred to herein as simply as a gasket 240 and is assumed to be a pliable material that can also be pierced with a needle. Additionally or alternatively, the gasket 240 can be somewhat rigid at some areas and pliable at specific locations where the fluid exchange using a syringe or other mechanism can occur.

FIG. 4B illustrates a close-up view of a small section of a fluid-filled interstitial cavity 450 that functions as a TIM to facilitate the transfer of heat from heat releasing surface 230 up to heat absorbing surface 360, according to one embodiment. Interstitial cavity 450 extends vertically between heat releasing surface 230 of heat generating and/or dissipating device (300, FIG. 3) and heat absorbing surface 360 of heatsink 350. As shown, both surfaces are irregularly and/or unevenly shaped as is typical with surface layer structure of most materials. The uneven surfaces provide surface points at which boiling and condensing of fluids can occur. Thus, heat releasing surface 230 provides a boiling, nucleation evaporation surface of interstitial cavity 450, while heat absorbing surface 230 provides a condensation surface within the fluid-based heat exchange cycle. Within interstitial cavity 450, above the heat releasing surface 230 is a first amount of fluid in liquid form (liquid 470). Above the liquid 470, is a second amount of fluid in gas or vapor form (gas 480). The curved line 475 running somewhat horizontally through the middle of the cavity 450 illustrates the phase separation between liquid 470 and gas/vapor 480. The actual amount of gas versus liquid within interstitial cavity 450 is dependent on, and in some ways directly correlated to, the amount of heat being passed to the liquid 470 at the heat releasing surface 230 and the rate of condensation occurring at the heat absorbing surface 360. At steady state, the liquid remains at or below saturation point and at least some of the fluid remains in liquid form to enable the liquid to absorb the heat from the heat releasing surface 230.

According to one embodiment, the lower level of the liquid 470 remains in contact with the heat releasing surface 230, which provides sufficient heat to increase the latent heat of the liquid up to a boiling or evaporation point of the working fluid under the given pressure conditions that exist within the interstitial cavity 450. In at least one embodiment, the amount of pressure within the interstitial cavity 450 is greater than would exist within normal atmosphere given the presence of a sealed environment with ongoing vaporization, and as such, the boiling point of the liquid can be triggered at a lower temperature than the normal boiling point of the fluid under normal atmospheric conditions. When the liquid 470 reaches its boiling point, additional latent heat absorbed by the liquid causes the bottom layer of the liquid that is in direct contact with the surface of the heat releasing surface 230 to undergo a phase change and to evaporate, creating bubbles of vapor/gas particles 425. The generated bubbles 425 rise up through the liquid surface and become a part of the layer of gas 480 within the cavity 450. These evaporating bubbles 425 are illustrated as open circles within the illustration.

At the top of interstitial cavity 450, vapor particles within the layer of gas 480 come into contact with the heat absorbing surface 360, which is maintained at a temperature that is lower than the boiling point of the fluid (i.e., at a temperature that supports condensation of the vapor). As the gas particles 425 come into contact with the heat absorbing surface 360, the latent heat is transferred from the gas 480 to the heat absorbing surface 360 and the gas condenses into liquid droplets 445. These liquid droplets 445 then fall back into the liquid 470 at the lower layer of the interstitial cavity 450. The liquid droplets 425 provide the boiling liquid more capacity for absorbing additional heat from the heat releasing surface 230.

Referring to FIG. 4A, the heat that is absorbed at the heat absorbing surface 360 is passed to the fins 365 and/or other cooling surfaces of the heat sink 350, such that the heat absorbing surface 360 remains at a cooler ambient temperature than exists within the interstitial cavity 450. By this application of dual heat exchanges across the exterior surfaces (i.e., surface 230 to liquid to gas and then gas to surface 360), heat that accumulates at the heat releasing surface 230 is eventually passed to the heatsink 350 via the fluid-based heat exchange interstitial cavity 450. It is appreciated that the heat exchange occurs during processing operation of the CPU 105 and that the cavity does not perform any heat exchange when the CPU is not operational, i.e., in a powered-off state. Depending on the thermal qualities of the working fluid utilized within interstitial cavity 450, heat exchange can occur even when the CPU is in a low powered state and maintaining only background level "sleep state" processing.

Figure 5:
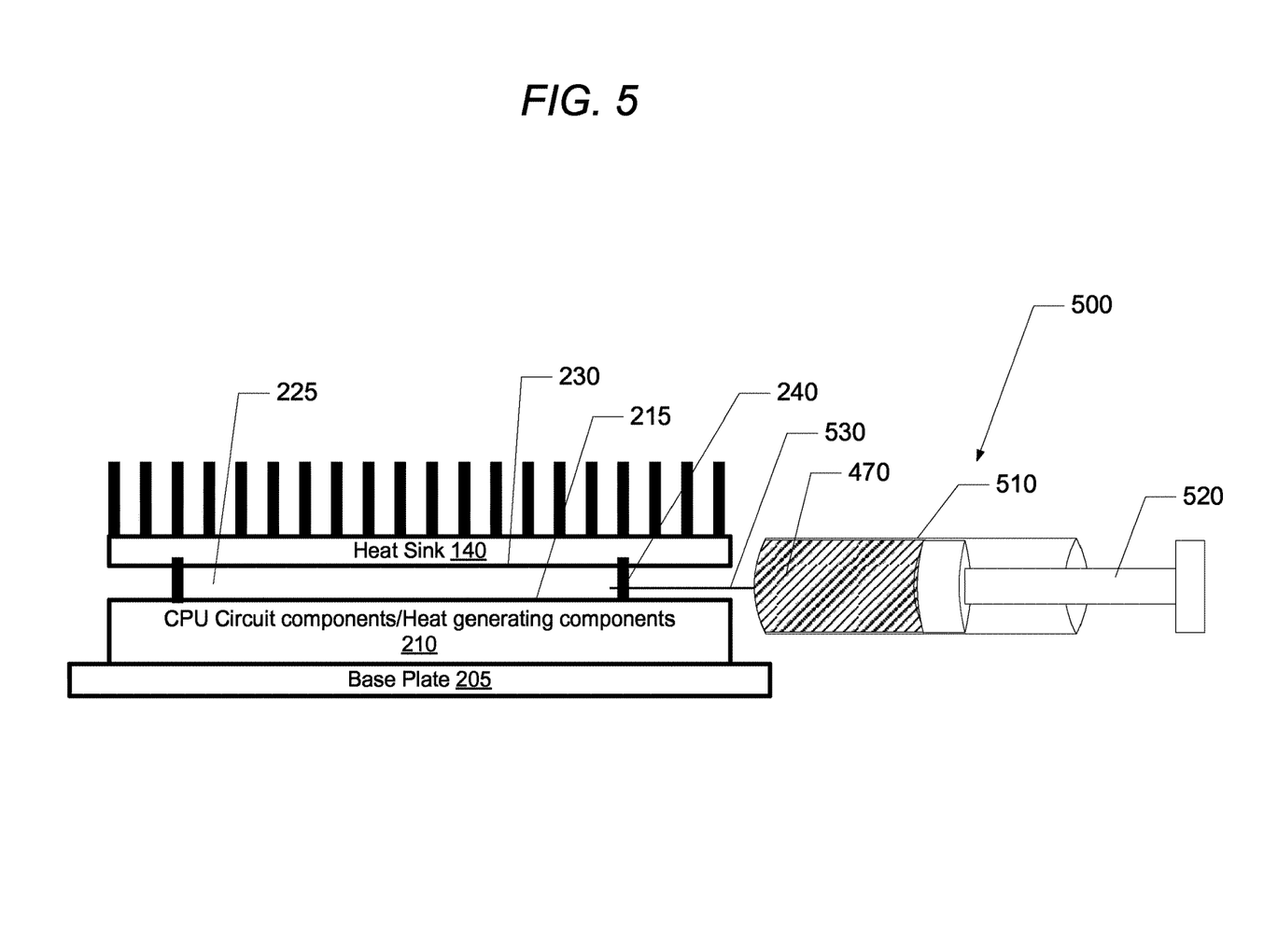
FIG. 5 illustrates one methodology for injecting the working fluid into the sealed interstitial cavity of the assembly, in accordance with one embodiment.

FIG. 5 illustrates one embodiment by which a working fluid can be provided within the sealed interstitial cavity. As shown, a syringe 500 is provided having a volumetric cylindrical body 510, a plunger 520, and a needle 530. Within the illustrated embodiment, a working fluid 470 is shown within the syringe. The needle 530 of the syringe 500 is inserted into the gasket 240 whereby the gasket is pierced by the needle 530. The working fluid 470 is then injected into the interstitial cavity 450 from the syringe 500 until sufficient liquid is inserted. The amount of liquid insertion in a particular cavity can be determined via empirical analysis using the volume of the cavity as one variable and the rate of heat exchange as another variable, among others.

Collectively, FIGS. 2-5 illustrate an assembly 400 for cooling a heat dissipating device. The assembly 400 includes: a heat dissipating device having a casing with a first heat releasing surface at which heat produced within or adjacent to the heat dissipating device accumulates and can be removed from the heat dissipating device. The assembly also includes a heatsink having a base panel with an exterior-facing heat absorbing surface which absorbs heat impacting the surface, the heat absorbing surface fixed in place across from the heat releasing surface by a first separation distance; and a gasket having a closed perimeter and which extends across the separation distance to form a volumetric space between the heat releasing surface and the heat absorbing surface and is sealably attached to both the heat releasing surface and the heat absorbing surface to provide a sealed interstitial cavity. The assembly further includes a working fluid disposed within the cavity and which has specific thermal properties that cause the fluid to (i) absorb latent heat and evaporate from a liquid to a vapor when the liquid contacts the heat releasing surface during operation of the heat dissipating device and (ii) condense from the vapor back to the liquid when the vapor contacts the heat absorbing surface of the heatsink, thus releasing the latent heat from the vapor to the heatsink.

According to one embodiment and as illustrated by FIG. 3, the assembly further includes: a groove created within at least one of the heat releasing surface and the heat absorbing surface, the groove having a perimeter shape that substantially mirrors a shape of the gasket. One of a top and a bottom surface of the gasket proximate to the groove is inserted within the groove to provide a mechanical seal. In yet another embodiment, the gasket is sealably affixed to at least one of the heat releasing surface and the heat absorbing surface and extends away from that surface to support direct insertion into the groove when the two surfaces are then brought together.

Also, within the assembly, the fluid serves as a thermal interface material that is a working transport medium between the heat releasing surface and the heat absorbing surface. In one embodiment, the cavity is sealed and provides a partial vacuum such that the working fluid exhibits specific thermal properties of the working fluid when disposed in the partial vacuum. And, in at least one embodiment, the working fluid is water. In at least one embodiment, the gasket comprises a self-resealable material and at least one insertion point for adding and replenishing a supply of the fluid via injection of the fluid.

According to one aspect of the disclosure, an information handling system includes at least one component requiring active heat dissipation. The information handling system includes the assembly described above to support removal of heat from the at least one component. The component can be a heat generating component or be adjacent to a heat generating component such that the heat dissipation can occur through the component and a connected heat sink via an interstitial cavity between the heat sink and the component.

Figure 6:
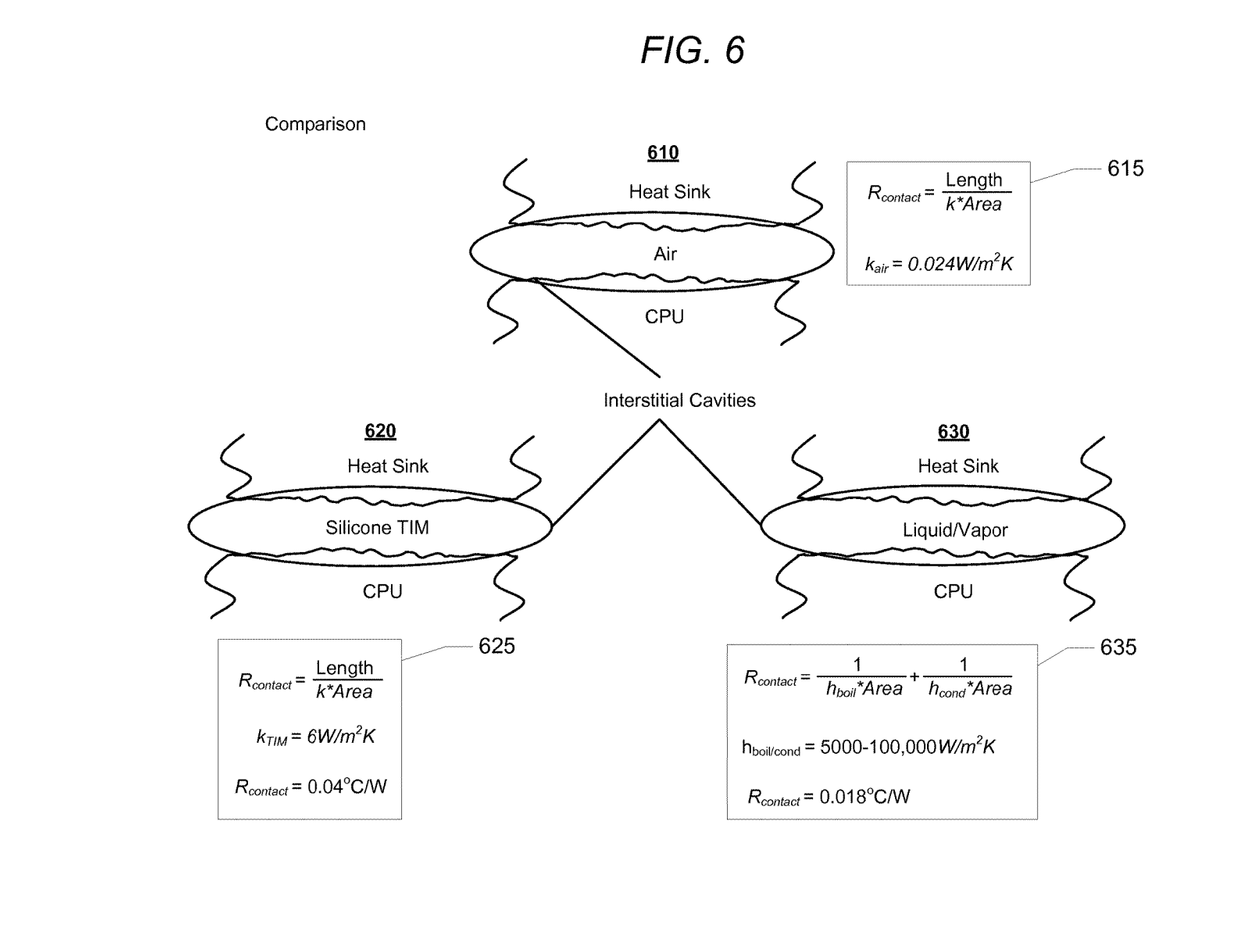
FIG. 6 generally provides a comparative view of the use of different thermal interface materials and their resulting thermal contact resistance, according to one embodiment.
Figure 7A:
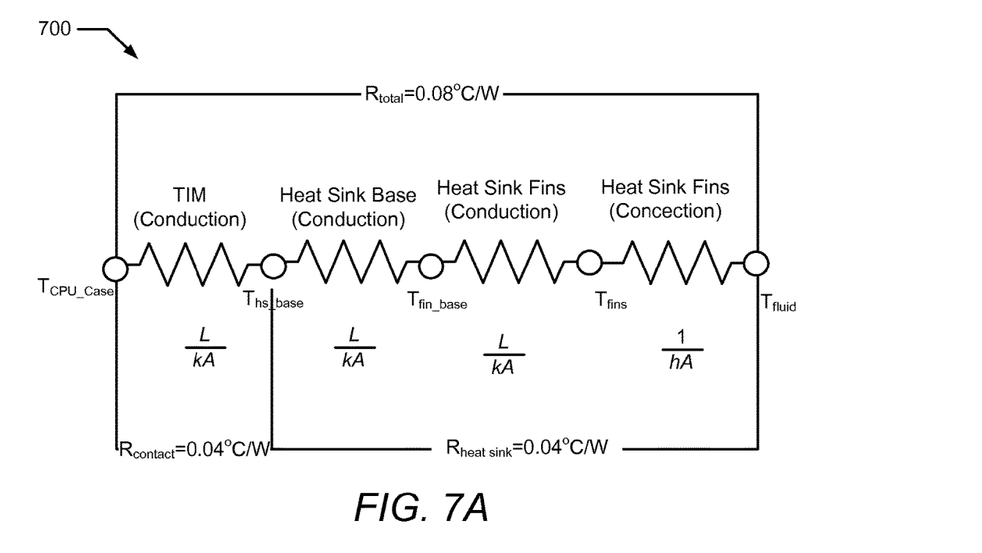
FIGS. 7A and 7B illustrates the resulting electrical resistance associated with each of two different implementations of TIMs, the second using the fluid based TIM, according to one or more embodiments.
Figure 7B:
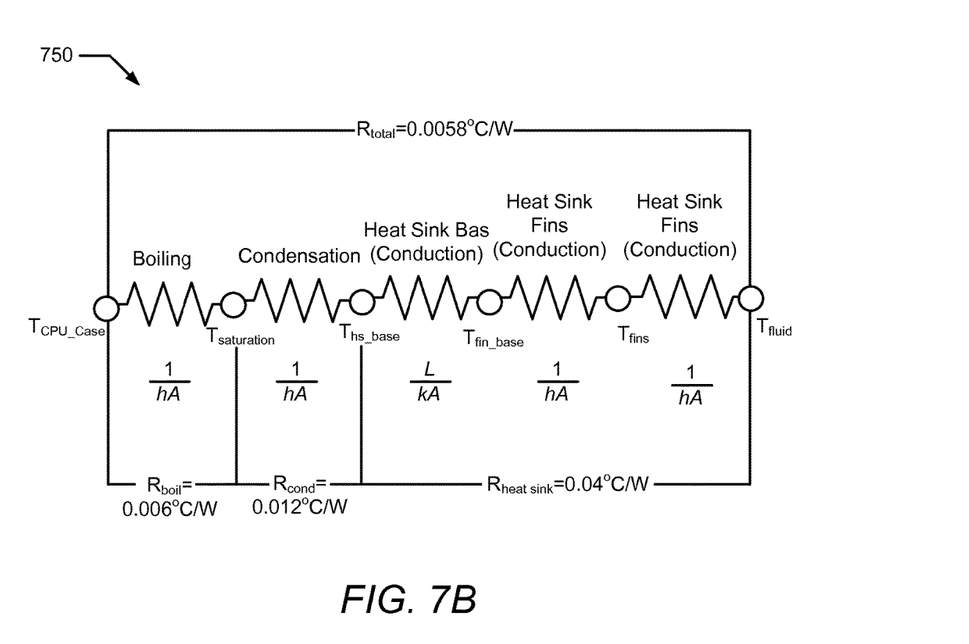

Referring now to FIGS. 6 and 7A-7B, FIG. 6 illustrates three different material makeup of example interstitial cavities using different TIMs, and the associated contact resistance computation and heat removal effectiveness for each material. FIGS. 7A-7B then illustrate two example circuit diagrams representing the comparative summation of the different resistivity of the overall assembly when silicone and a working fluid are respectively utilized as the TIMs within a similarly configured assembly having a same dimension interstitial cavity, according to one embodiment. In FIGS. 6 and 7, the contact resistance is determined by the equations shown in the boxes 615, 625, 635. As shown with FIG. 6, in a first example implementation 610, air is utilized as the TIM within the interstitial cavity (i.e., no actual solid substance or fluid is provided within the cavity), and a singular thermal contact resistance value is determined as the length divided by the product of k (heat transfer coefficient of air) and the area. As provided by box 615, the value k for air is 0.024 W/m²K. When silicone is utilized as the TIM in a second example implementation 620, the resulting singular thermal contact resistance is similarly determined using k (silicone) value of 6 W/m²K, as indicated within box 625. However, with the fluid-based TIM described herein and presented via the third example implementation 630, box 635 indicates that determining the contact resistance requires an evaluation of the two contact points which have separate contact resistive values based on the respective boiling and condensation heat transfer coefficients (h) and the two separate resistive values are then summed together to yield the overall thermal contact resistance. Within the illustrations, h represents the amount of heat (in Watts) that a surface exchanges with a fluid per unit of area. Box 635 further illustrates that the values of h for boiling and condensation ranges between 5000-100,000 W/m²K. Extending this evaluation to FIGS. 7A-7B, FIG. 7A shows that the resulting thermal contact resistance ($R_{total}$) generated as a sum 700 of the different resistances of the assembly, where silicone is used as the TIM is 0.04° C./W. FIG. 7B illustrates that for the same assembly, configured as shown herein with a gasket and working fluid inserted therein, the resulting thermal contact resistance is the sum of 0.006° C./W boiling+0.012° C./W condensing for a total thermal contact resistance of 0.018° C./W, which is approximately half that of silicon. The sum 750 of resistances indicates the additional resistance added for boiling and condensation points within the assembly, as opposed to the single contact resistance with the sum 700 provided for the silicone based assembly.

Figure 8:
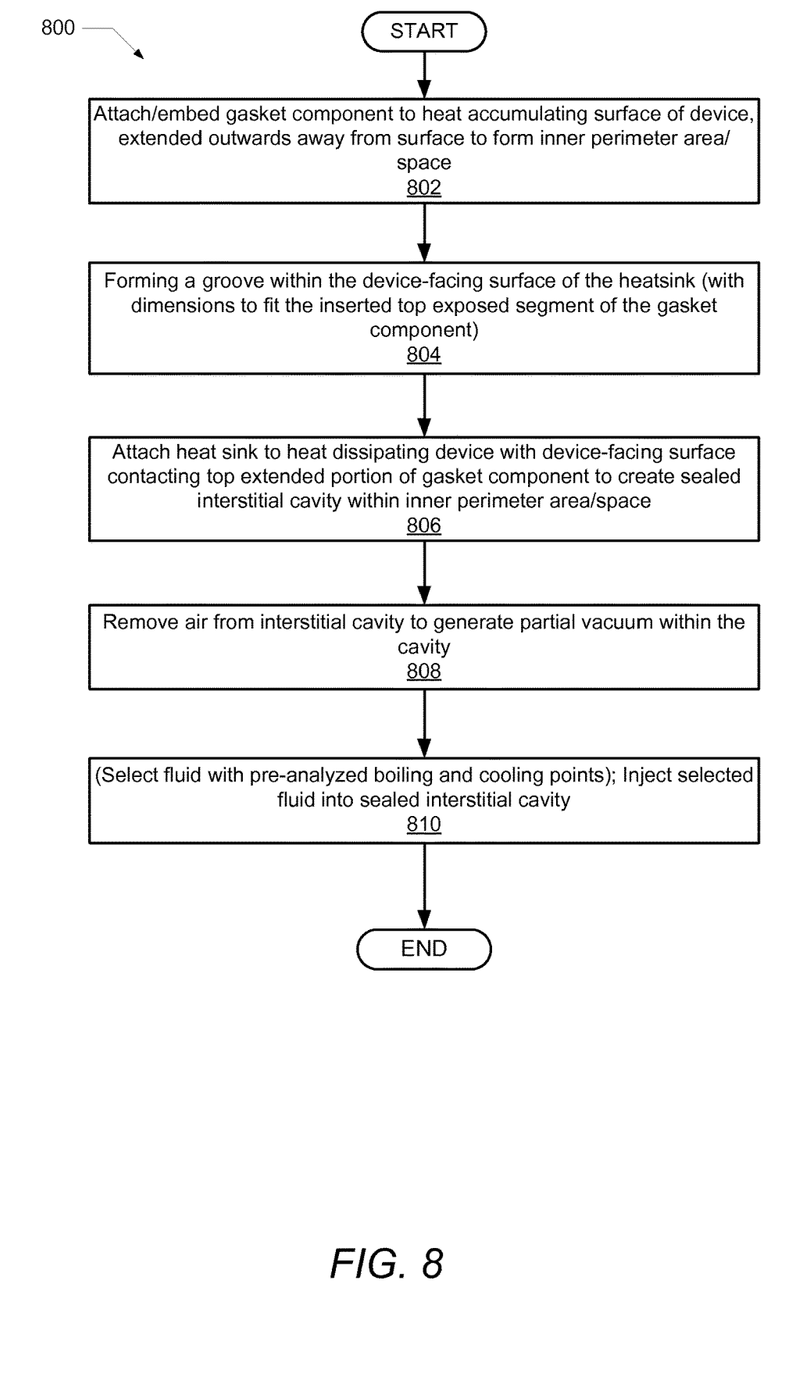
FIG. 8 is a flow chart of a method for manufacturing the example assembly of FIG. 2 to provide reduced thermal contact resistance, according to one or more embodiments.

FIG. 8 is a flowchart depicting the method 800 for manufacturing the assembly 400 introduced above to cool a heat producing device. As a manufacturing process, many of the process steps are completed by machines under the control of one or more humans or computers. Certain aspects of method 800 can be implemented in code that is executed by processor to perform the specific functions described. The description of method 800 is provided with general reference to the specific components illustrated within the preceding FIGS. 1-5. Method 800 is presented with optional processes presented in blocks having dashed outlines. Method 800 begins at start block and proceeds to block 802 at which method 800 includes providing a gasket attached to a heat releasing surface of a heat dissipating device. The gasket extends outwards away from the heat releasing surface to form an inner perimeter space/area. In one embodiment providing the gasket includes fabricating the gasket component on the heat releasing surface as a fixed part of the heat releasing surface and extending vertically away from the surface with an inner perimeter space. In an alternate embodiment, providing the gasket includes sticking or gluing the gasket component onto the heat releasing surface with a heat resistant epoxy. As provided at block 804, method 800 can optionally include forming a groove within the heat absorbing surface of the heatsink, the groove having outer and inner perimeter shape and dimensions that accommodate a shape and width of the top portion of the gasket to enable a physical insertion of the top portion of the gasket component within the groove, and allowing for a mechanical sealing of the interior volume of the gasket. The method also includes fixably attaching a heatsink to the heat dissipating device such that a heat absorbing surface of the heatsink contacts a top extended perimeter of the gasket to create a sealed interstitial cavity within the inner perimeter space (block 806). According to one embodiment, the method 800 can optionally include removing air from the interstitial cavity to generate a partial vacuum within the cavity (block 808). Finally, the method includes injecting a working fluid into the sealed interstitial cavity (block 810). As shown in FIG. 5, a syringe 500 with a needle 530 can be utilized to perform the fluid injection. The needle 530 is sufficiently small to create only a small bore in the gasket and the material of the gasket at which the needle is inserted is sufficiently pliable such that the material seals back into place once the needle is removed. In at least one embodiment, the fluid is injected at a saturation point that causes the fluid to undergo a liquid to gas phase change whenever heat is produced at the heat releasing surface of the heat dissipating device. For this implementation, a syringe can also be utilized to remove some of the air from within the cavity to create a partial vacuum that allows for insertion of the fluid at the saturation point to allow for easier boiling when heat is applied. During operations that produce heat, the fluid further undergoes a gas to liquid phase change when the gas generated by the liquid to gas phase change comes into contact with the heat absorbing surface of the heatsink.

In some implementations, certain steps of the above flow chart methods are combined, performed simultaneously or in a different order, or perhaps omitted, without deviating from the scope of the disclosure. Thus, while the method blocks are described and illustrated in a particular sequence, use of a specific sequence of functional processes represented by the blocks is not meant to imply any limitations on the disclosure. Changes may be made with regards to the sequence of processes without departing from the scope of the present disclosure. Use of a particular sequence is therefore, not to be taken in a limiting sense, and the scope of the present disclosure is defined only by the appended claims.

Aspects of the present disclosure are described above with reference to flowchart illustrations and/or block diagrams of methods, apparatus (systems) and computer program products according to embodiments of the disclosure. It will be understood that each block of the flowchart illustrations and/or block diagrams, and combinations of blocks in the flowchart illustrations and/or block diagrams, can be implemented by computer program instructions. Computer program code for carrying out operations for aspects of the present disclosure may be written in any combination of one or more programming languages, including an object oriented programming language, without limitation. These computer program instructions may be provided to a processor of a general purpose computer, special purpose computer, such as a service processor, or other programmable data processing apparatus to produce a machine, such that the instructions, which execute via the processor of the computer or other programmable data processing apparatus, performs the method for implementing the functions/acts specified in the flowchart and/or block diagram block or blocks.

One or more of the embodiments of the disclosure described can be implementable, at least in part, using a software-controlled programmable processing device, such as a microprocessor, digital signal processor or other processing device, data processing apparatus or system. Thus, it is appreciated that a computer program for configuring a programmable device, apparatus or system to implement the foregoing described methods is envisaged as an aspect of the present disclosure. The computer program may be embodied as source code or undergo compilation for implementation on a processing device, apparatus, or system. Suitably, the computer program is stored on a carrier device in machine or device readable form, for example in solid-state memory, magnetic memory such as disk or tape, optically or magneto-optically readable memory such as compact disk or digital versatile disk, flash memory, etc. The processing device, apparatus or system utilizes the program or a part thereof to configure the processing device, apparatus, or system for operation.

As will be further appreciated, the processes in embodiments of the present disclosure may be implemented using any combination of software, firmware or hardware. Accordingly, aspects of the present disclosure may take the form of an entire hardware embodiment or an embodiment combining software (including firmware, resident software, microcode, etc.) and hardware aspects that may all generally be referred to herein as a "circuit," "module," or "system." Furthermore, aspects of the present disclosure may take the form of a computer program product embodied in one or more computer readable storage device(s) having computer readable program code embodied thereon. Any combination of one or more computer readable storage device(s) may be utilized. The computer readable storage device may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage device would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage device may be any tangible medium that can contain, or store a program for use by or in connection with an instruction execution system, apparatus, or device.

While the disclosure has been described with reference to exemplary embodiments, it will be understood by those skilled in the art that various changes may be made and equivalents may be substituted for elements thereof without departing from the scope of the disclosure. In addition, many modifications may be made to adapt a particular system, device or component thereof to the teachings of the disclosure without departing from the essential scope thereof. Therefore, it is intended that the disclosure not be limited to the particular embodiments disclosed for carrying out this disclosure, but that the disclosure will include all embodiments falling within the scope of the appended claims. Moreover, the use of the terms first, second, etc. do not denote any order or importance, but rather the terms first, second, etc. are used to distinguish one element from another.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The description of the present disclosure has been presented for purposes of illustration and description, but is not intended to be exhaustive or limited to the disclosure in the form disclosed. Many modifications and variations will be apparent to those of ordinary skill in the art without departing from the scope of the disclosure. The described embodiments were chosen and described in order to best explain the principles of the disclosure and the practical application, and to enable others of ordinary skill in the art to understand the disclosure for various embodiments with various modifications as are suited to the particular use contemplated.

What is claimed is:

1. An assembly comprising:
a heat dissipating device having a casing with a heat releasing surface at which heat produced within or adjacent to the heat dissipating device accumulates and is removed from the heat dissipating device, the heat dissipating device having a plurality of screw bolt holes;
a heatsink having a base panel with an exterior-facing heat absorbing surface that absorbs the heat impacting the surface, the heat absorbing surface fixed in place across from the heat releasing surface by a separation distance, the heatsink having offsetting screw holes for insertion of screw bolts extending from the screw bolt holes of the heat dissipating device when the heat dissipating device and heatsink are assembled together with nuts screwed onto the screw bolts, the heat sink installed on top of the heat releasing surface of the heat dissipating device, wherein the heatsink is a cold plate having a second surface with a plurality of fins opposed to the heat absorbing surface, the second surface and plurality of fins cooled via an active air supply providing convection cooling using air movement generated by a fan;
a gasket having a closed perimeter and which extends upwards across the separation distance to form a volumetric space between the heat releasing surface and the heat absorbing surface, the gasket being sealably attached to both the heat releasing surface and the heat absorbing surface to provide a sealed interstitial cavity, wherein the gasket comprises a self-resealable material that enables use of a syringe to add and replenish a supply of a working fluid via physical injection of the working fluid; and
a groove created within at least one of the heat releasing surface or the heat absorbing surface, the groove having a perimeter shape that substantially mirrors a shape of the gasket, wherein one of a top and a bottom surface of the gasket proximate to the groove is inserted within the groove to provide a mechanical seal;
wherein the working fluid disposed within the sealed interstitial cavity and which has specific thermal properties that cause the working fluid to (i) absorb latent heat and evaporate from a liquid to a vapor when the liquid contacts the heat releasing surface during operation of the heat dissipating device, wherein the liquid evaporates to create bubbles of vapor particles that rises up through a liquid surface and become a part of the vapor within the sealed interstitial cavity, and (ii) condense from the vapor back to the liquid when the vapor contacts the heat absorbing surface of the heatsink, thus releasing the latent heat from the vapor to the heatsink, wherein the vapor condenses at the heat absorbing surface into liquid droplets that fall back into the liquid at a lower layer of the sealed interstitial cavity, and wherein the working fluid is replenished via use of the syringe having a needle that is inserted through the self-resealable material of the gasket into the sealed interstitial cavity, wherein the working fluid serves as a thermal interface material that is a working transport medium between the heat releasing surface and the heat absorbing surface, and wherein the sealed interstitial cavity is sealed and provides a partial vacuum such that the working fluid exhibits specific thermal properties of the working fluid when disposed in the partial vacuum.

2. The assembly of claim 1, wherein the gasket is sealably affixed to at least one of the heat releasing surface and the heat absorbing surface and extends away from the at least one of the heat releasing surface or the heat absorbing surface to support direct insertion of the gasket into the groove when the the heat releasing surface and the heat absorbing surface are brought together.

3. The assembly of claim 1, wherein the working fluid is water and water vapor.

4. The assembly of claim 1, wherein the heat dissipating device comprises a central processing unit (CPU).

5. The assembly of claim 1, wherein the needle of the syringe is inserted into the gasket, whereby the gasket is pierced by the needle, and the working fluid is then injected into the sealed interstitial cavity from the syringe until sufficient amounts of the liquid is inserted, as determined via empirical analysis using a volume of the sealed interstitial cavity as one variable and a rate of heat exchange as another variable.

6. The assembly of claim 1, wherein during the replenishment of the working fluid, the needle creates a small bore in the gasket and the self-resealable material of the gasket at which the needle is inserted is pliable and seals back into place once the needle is removed.

7. The assembly of claim 1, wherein the sealed interstitial cavity comprises a partial vacuum, which causes the working fluid to be at a saturation point and allows for easier boiling of the working fluid whenever the heat is produced at the heat releasing surface of the heat dissipating device, the heat being applied to the working fluid at the saturation point that causes the working fluid to undergo a liquid-to-gas phase change.

8. An information handling system having at least one component requiring active heat dissipation, the information handling system comprising:
   a heat dissipating device having a casing with a heat releasing surface at which heat produced within or adjacent to the heat dissipating device accumulates and is removed from the heat dissipating device, the heat dissipating device having a plurality of screw bolt holes;
   a heatsink having a base panel with an exterior-facing heat absorbing surface that absorbs heat impacting the surface, the heat absorbing surface fixed in place across from the heat releasing surface by a separation distance, the heatsink having offsetting screw holes for insertion of screw bolts extending from the screw bolt holes of the heat dissipating device when the components are assembled together with nuts screwed onto the screw bolts, the heatsink installed on top of the heat releasing surface of the heat dissipating device, wherein the heatsink is a cold plate having a second surface with a plurality of fins opposed to the heat absorbing surface, the second surface and plurality of fins cooled via an active air supply providing convection cooling using air movement generated by at least one air moving device;
   a gasket having a closed perimeter and which extends upwards across the separation distance to form a volumetric space between the heat releasing surface and the heat absorbing surface, the gasket being sealably attached to both the heat releasing surface and the heat absorbing surface to provide a sealed interstitial cavity, wherein the gasket comprises a self-resealable material that enables use of a syringe to add and replenish a supply of working fluid via physical injection of the working fluid;
   a groove created within at least one of the heat releasing surface or the heat absorbing surface, the groove having a perimeter shape that substantially mirrors a shape of the gasket, wherein one of a top and a bottom surface of the gasket proximate to the groove is inserted within the groove to provide a mechanical seal; and
   a working fluid disposed within the sealed interstitial cavity and which has specific thermal properties that cause the fluid to (i) absorb latent heat and evaporate from a liquid to a vapor when the liquid contacts the heat releasing surface during operation of the heat dissipating device, wherein the liquid evaporates to create bubbles of vapor particles that rises up through a liquid surface and become a part of gas within the sealed interstitial cavity, and (ii) condense from the vapor back to the liquid when the vapor contacts the heat absorbing surface of the heatsink, thus releasing the latent heat from the vapor to the heatsink, wherein the vapor condenses at the heat absorbing surface into liquid droplets that fall back into the liquid at a lower layer of the sealed interstitial cavity, and wherein the working fluid is replenished via use of the syringe having a needle that is inserted through the self-resealable material of the gasket into the sealed interstitial cavity, wherein the working fluid serves as a thermal interface material that is a working transport medium between the heat releasing surface and the heat absorbing surface, and wherein the sealed interstitial cavity is sealed and provides a partial vacuum such that the working fluid exhibits specific thermal properties of the working fluid when disposed in the partial vacuum.

9. The information handling system of claim 8, wherein the gasket is sealably affixed to at least one of the heat releasing surface or the heat absorbing surface and extends away from the at least one of the heat releasing surface or the heat absorbing surface to support direct insertion of the gasket into the groove when the heat releasing surface and the heat absorbing surface are brought together.

10. The information handling system of claim 8, wherein the working fluid is water and water vapor.

11. The information handling system of claim 8, wherein the heat dissipating device comprises a central processing unit (CPU).

12. The information handling system of claim 8, wherein: the information handling system further comprises the at least one air moving device that directs air over the second surface to create the convection cooling of the cold plate.

13. The information handling system of claim 8, wherein the needle of the syringe is inserted into the gasket, whereby the gasket is pierced by the needle, and the working fluid is then injected into the sealed interstitial cavity from the syringe until sufficient amounts of the liquid is inserted, as determined via empirical analysis using a volume of the sealed interstitial cavity as one variable and a rate of heat exchange as another variable.

14. The information handling system of claim 8, wherein during the replenishment of the working fluid, the needle creates a small bore in the gasket and the self-resealable material of the gasket at which the needle is inserted is pliable and seals back into place once the needle is removed.

15. The information handling system of claim 8, wherein the working fluid is at a saturation point that causes the fluid to undergo the liquid-to-gas phase change whenever the heat is produced at the heat releasing surface of the heat dissipating device.

16. The information handling system of claim 8, wherein the sealed interstitial cavity comprises a partial vacuum, that causes the working fluid to be at a saturation point and allows for easier boiling of the working fluid when the heat is applied.

17. A method for cooling a heat producing device, the method comprising:
  providing a gasket component attached to a heat releasing surface of a heat dissipating device, the gasket component extending outwards away from the heat releasing surface and forming a closed inner perimeter space;
  fixably attaching a heatsink to the heat dissipating device such that an exterior-facing heat absorbing surface of the heatsink sealably impacts against a top of an extended portion of the gasket component to create a sealed interstitial cavity within the closed inner perimeter space; and
  injecting a working fluid into the sealed interstitial cavity, the working fluid having thermal properties that (i) causes liquid of the working fluid in contact with the heat releasing surface to undergo a liquid-to-vapor phase change when heat is being released from the heat releasing surface of the heat dissipating device and (ii) causes vapor of the working fluid in contact with the heat absorbing surface of the heatsink to release latent heat and undergo a vapor-to-liquid phase change when the vapor within the cavity comes into contact with the heat absorbing surface;
  wherein the working fluid serves as a thermal interface material that is a working transport medium between the heat releasing surface and the heat absorbing surface, and wherein the sealed interstitial cavity is sealed and provides a partial vacuum such that the working fluid exhibits specific thermal properties of the working fluid when disposed in the partial vacuum;
  wherein the vapor condenses at the heat absorbing surface into liquid droplets that fall back into the liquid at a lower layer of the sealed interstitial cavity;
  wherein the working fluid is replenished via use of a syringe having a needle that is inserted through a self-resealable material of the gasket component into the sealed interstitial cavity;
  wherein the heat dissipating device has a casing with the heat releasing surface at which the heat produced within or adjacent to the heat dissipating device accumulates and is removed from the heat dissipating device, the heat dissipating device having a plurality of screw bolt holes;
  wherein the heatsink has a base panel with the exterior-facing heat absorbing surface that absorbs the heat impacting the heat absorbing surface, the heat absorbing surface fixed in place across from the heat releasing surface by a separation distance, the heatsink having offsetting screw holes for insertion of screw bolts extending from the screw bolt holes of the heat dissipating device when the heat dissipating device and heatsink are assembled together with nuts screwed onto the screw bolts, the heatsink installed on top of the heat releasing surface of the heat dissipating device,
  wherein the heatsink is a cold plate having a second surface with a plurality of fins opposed to the heat absorbing surface, the second surface and plurality of fins cooled via an active air supply providing convection cooling using air movement generated by at least one air moving device;
  wherein the gasket component has a closed perimeter shape and extends upwards across the separation distance to form the sealed interstitial cavity between the heat releasing surface and the heat absorbing surface;
  wherein the gasket component comprises the self-resealable material that enables use of the syringe to add and replenish a supply of the working fluid via physical injection of the working fluid;
  creating a groove within at least one of the heat releasing surface or the heat absorbing surface, the groove having a perimeter shape that substantially mirrors a shape of the gasket component; and
  inserting one of a top and a bottom surface of the gasket component proximate to the groove into the groove to provide a mechanical seal.

18. The method of claim 17, further comprising removing air from the sealed interstitial cavity to generate the partial vacuum within the sealed interstitial cavity, prior to injecting the working fluid into the sealed interstitial cavity, wherein the working fluid is injected at a saturation point.

19. The method of claim 17, wherein providing the gasket component further comprises fabricating the gasket component on the heat releasing surface.

20. The method of claim 17, wherein the creating the groove within the at least one of the heat releasing surface or the heat absorbing surface comprises forming the groove within the heat absorbing surface of the heatsink, the groove having specific dimensions and the closed perimeter shape substantially mirrors a perimeter shape and width of a top portion of the gasket component to enable a physical insertion of the top portion of the gasket component within the groove, sealing an interior volume of the gasket when the heatsink is attached to the heat dissipating device.

* * * * *